United States Patent [19]

Arai et al.

[11] Patent Number: 4,928,073
[45] Date of Patent: May 22, 1990

[54] DC AMPLIFIER

[75] Inventors: Minoru Arai; Yukihiro Katoh, both of Tokyo, Japan

[73] Assignee: Iwatsu Electric Co., Ltd., Tokyo, Japan

[21] Appl. No.: 338,878

[22] Filed: Apr. 14, 1989

[30] Foreign Application Priority Data

May 7, 1988 [JP] Japan .................. 63-110795

[51] Int. Cl.$^5$ .............................................. H03F 3/45
[52] U.S. Cl. .................................... 330/252; 330/311
[58] Field of Search ................ 330/252, 261, 311, 69

[56] References Cited

U.S. PATENT DOCUMENTS 4,605,906 8/1986 Miller ................................... 330/252

Primary Examiner—James B. Mullins
Attorney, Agent, or Firm—Blakely, Sokoloff, Taylor & Zafman

[57] ABSTRACT

A DC amplifier includes first and second transistors, an emitter resistor, and a load resistor. The first and second transistors constitute a differential amplification transistor pair. The emitter resistor is connected between the emitters of the first and second transistors. The load resistor is connected between the collectors of the transistors. The resistance of the load resistor is set to be ½ that of the emitter resistor. The emitters of third and fourth transistors equivalent to the first and second transistors are series-connected to the collectors of the first and second transistors through the load resistor. The biases of the third and fourth transistors are set to be close to those of the first and second transistors.

2 Claims, 1 Drawing Sheet

DC AMPLIFIER

BACKGROUND OF THE INVENTION

The present invention relates to a DC differential amplifier and, more particularly, to a highly stable DC amplifier having less temperature dependency and a large margin with respect to changes in gain due to absolute value variations of circuit elements such as transistors and resistors constituting the amplifier.

FIG. 3 shows a typical conventional DC differential amplifier. As shown in FIG. 3, in this amplifier, a pair of transistors $Q_1$ and $Q_2$ each having a base as an input terminal constitute a differential amplification transistor pair, and their emitters are connected to each other through an emitter resistor $R_E$ and are connected to a constant voltage source $V_E$ through resistors $R_1$ and $R_2$. The collectors of the pair of transistors $Q_1$ and $Q_2$ are respectively cascode-connected to the emitters of common base transistors $Q_3$ and $Q_4$, and are further connected to to a constant voltage source $V_C$ through load resistors $R_{L1}$ and $R_{L2}$. In this case, the resistors $R_1$ and $R_2$ and the constant voltage $V_E$ have predetermined values so as to cause the transistors $Q_1$ and $Q_2$ to be driven by a current source. The transistors $Q_3$ and $Q_4$ are cascode-connected to each other so as to reduce the Miller effect. However, A DC operation is kept unchanged without them. Note that reference symbol $V_B$ denotes a constant voltage source for applying a constant bias potential to the bases of the transistors $Q_3$ and $Q_4$.

In the amplifier having the above-described arrangement, if a load resistor is represented by $R_L = R_{L1} = R_{L2}$, input and output voltages are respectively represented by $V_{in}$ and $V_{out}$, and the emitter resistance of the transistor is represented by $r_E$, an output voltage from the half of the differential amplifier can be given by the following equation:

$$V_{out} = \{R_L/(r_E + R_E/2)\} \cdot V_{in} \quad (1)$$

In this case, if the operation state of the transistor is carefully checked, it is found that an amount of heat generated by the transistor ($P \approx I_C \times V_{CE}$; $I_C$: a collector current; $V_{CE}$ a voltage between the collector and the emitter) is changed upon application of the input voltage $V_{in}$. Upon this change, a slight change ($\Delta V_{BE}$) of a voltage between the base and emitter of the transistor occurs. This change is equivalent to a further change in input voltage $V_{in}$. The output voltage $V_{out}$ at this time can be represented by the following equation:

$$V_{out} = \{R_L/(r_E + R_E/2)\} \cdot (V_{in} + \Delta V_{BE}) \quad (2)$$

As described above, the conventional amplifier cannot be free from the influence of the change $\Delta V_{BE}$. Note that the change $\Delta V_{BE}$ is generally given as $$\Delta V_{BE} \approx -2 \text{ mV/°C.} \quad (3)$$

SUMMARY OF THE INVENTION

It is an object of the present invention to provide a DC differential amplifier which is highly stable with respect to temperature changes.

It is another object to provide a DC differential amplifier whose margin with respect to changes in gain due to absolute value variations of circuit elements can be increased.

In order to achieve the above objects, according to the present invention, there is provided a DC amplifier comprising first and second transistors constituting a differential amplification transistor pair, an emitter resistor connected between emitters of the transistors, and a load resistor connected between collectors of the first and second transistors, wherein a resistance of the load resistor is set to be ½ that of the emitter resistor, emitters of third and fourth transistors equivalent to the first and second transistors are series-connected to the collectors of the first and second transistors through the load resistor, and biases of the third and fourth transistors are set to be close to those of the first and second transistors.

According to the DC amplifier of the present invention, therefore, an output voltage is not influenced by the base-emitter voltage $V_{BE}$ of each transistor, so that stability in operation can be increased. In addition, the margin of the amplifier with respect to changes in gain due to absolute value variations of circuit elements such as transistors and resistors constituting the amplifier.

DETAILED DESCRIPTION OF THE PREFERRED EMBODIMENTS

Embodiments of the present invention will be described in detail below with reference to the accompanying drawings.

Figure 1:
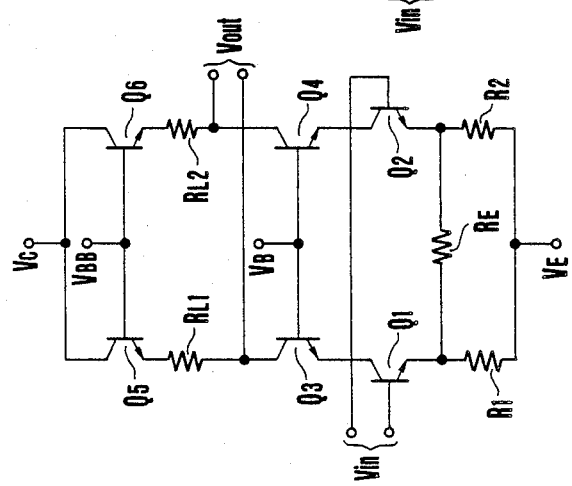
FIG. 1 is a circuit diagram showing a DC amplifier according to an embodiment of the present invention.

FIG. 1 shows a DC amplifier according to an embodiment of the present invention. Reference symbols $Q_1$ to $Q_6$ denote identical NPN transistors; $R_1$, $R_2$, $R_E$, $R_{L1}$, and $R_{L2}$, resistors; and $V_E$, $V_B$, $V_{BB}$, and $V_C$, constant voltage sources.

Figure 3:
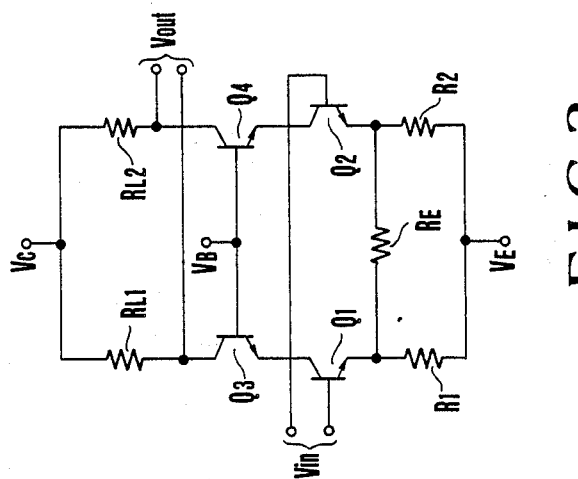
FIG. 3 is a circuit diagram showing a conventional cascode type differential amplifier.

Referring to FIG. 1, the pair of transistors $Q_1$ and $Q_2$ constitute a differential amplification transistor pair, and an input voltage $V_{in}$ is applied between the bases thereof. The emitters of the transistors $Q_1$ and $Q_2$ are connected to the constant voltage source $V_E$ through the resistors $R_1$ and $R_2$. At the same time, these emitters are connected to each other through a resistor, i.e., the emitter resistor $R_E$. The collectors of the pair of transistors $Q_1$ and $Q_2$ are respectively cascode-connected to the emitters of common base transistors $Q_3$ and $Q_4$. The bases of the transistors $Q_3$ and $Q_4$ are commonly connected to the constant voltage source $V_B$. In addition, the collectors of the transistors $Q_3$ and $Q_4$ are respectively connected to the emitters of the transistors $Q_5$ and $Q_6$ through the load resistors $R_{L1}$ and $R_{L2}$. The bases and collectors of the transistors $Q_5$ and $Q_6$ are commonly connected to the constant voltage sources $V_{BB}$ and $V_C$, respectively. In this case, output terminals are formed between the collectors of the transistors $Q_3$ and $Q_4$. Note that the same reference symbols in FIG. 1 denote the same parts as in FIG. 3.

In the DC amplifier having the above-described arrangement, the half thereof will be described below. In this case, an output voltage $V_{out}$ can be represented as follows:

$$V_{out'} = \{(r_E+R_L)/(r_E+R_E/2)\} \cdot V_{in} + \{(r_E+R_L)/(r_E+R_E/2)\} \cdot \Delta V_{BE} - \Delta V_{BE} \quad (4)$$

where $R_E << R_1 = R_2$.

In equation (4), the first term of the right-hand side is an output voltage determined by the input voltage $V_{in}$, and a value defined by the second term is generated when heat generated by the transistors $Q_1$ and $Q_2$ is changed upon a bias change due to the input voltage $V_{in}$, and their base-emitter voltage $V_{BE}$ is changed. In addition, the third term corresponds to the base-emitter voltage $V_{BE}$ of the transistor $Q_5$. If the base currents of the transistors $Q_1$, $Q_3$, and $Q_5$ can be neglected, an entire operating current of the transistor $Q_1$ is supplied through the transistor $Q_5$. Therefore, changes in $V_{BE}$ caused by this current become equal in the transistors $Q_1$ and $Q_5$. In addition, if collector-emitter voltages $V_{CE}$ of the transistors $Q_1$ and $Q_5$ are set to be equal to each other, collector losses in operative states of transistors are equal to each other. Hence, changes in $V_{BE}$ due to heat are equal to each other.

If the resistance of the load resistor $R_L$ ($R_{L1} = R_{L2}$) is determined so as to set the coefficient of $\Delta V_{BE}$ of the second term of equation (4) to be "1", the following equations can be established:

$$(r_E + R_L)/(r_E + R_E/2) = 1 \quad (5)$$

$$\therefore R_L = R_E/2 \quad (6)$$

If equation (6) is substituted into equation (4), $$V_{out'} = V_{in} \quad (7)$$

Therefore, if the resistor $R_E$ is used as the load resistor $R_L$ in parallel connection, a high-performance DC amplifier having a gain of "1" and free from the influence of the absolute value of the resistor $R_E$ and the change $\Delta V_{BE}$ can be realized.

Figure 2:
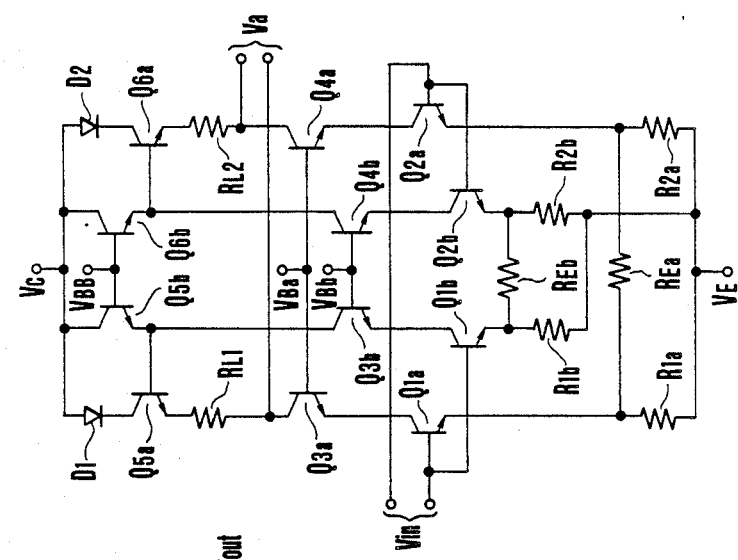
FIG. 2 is a circuit diagram showing a DC amplifier according another embodiment of the present invention.

FIG. 2 is a circuit diagram showing another embodiment of the present invention. Similar to FIG. 1, FIG. 2 shows a DC amplifier having a gain of "2" and free from the influences of the absolute value of a resistor and the change $\Delta V_{BE}$ and an input voltage. Referring to FIG. 2, reference symbols $Q_{1a}$ to $Q_{6a}$ and $Q_{1b}$ to $Q_{6b}$ denote identical NPN transistors; $R_{1a}$, $R_{1b}$, $R_{2a}$, $R_{2b}$, $R_{Ea}$, $R_{L1}$, and $R_{L2}$, resistors, respectively; $D_1$ and $D_2$, diodes; and $V_E$, $V_{Ba}$, $V_{Bb}$, $V_{BB}$, and $V_C$, constant voltage sources, respectively.

In this case, two pairs of transistors $Q_{1a}$ and $Q_{2a}$ and $Q_{1b}$ and $Q_{2b}$ respectively constitute differential amplification transistor pairs connected in parallel. An input voltage $V_{in}$ is applied between the bases of the transistors $Q_{1a}$ and $Q_{1b}$ and of the transistors $Q_{2a}$ and $Q_{2b}$. The emitters of the two transistors $Q_{1a}$ and $Q_{2a}$ and the two transistors $Q_{1b}$ and $Q_{2b}$ are connected to each other through the resistors $R_{Ea}$ and $R_{Eb}$, respectively. These emitters are connected to a constant voltage source $V_E$ through the resistors $R_{1a}$, $R_{1b}$, $R_{2a}$, and $R_{2b}$.

The collectors of the transistors $Q_{1a}$ and $Q_{2a}$ are respectively cascode-connected to the emitters of the common base transistors $Q_{3a}$ and $Q_{4a}$. The collectors of the transistors $Q_{3a}$ and $Q_{4a}$ constitute output terminals of the amplifier and are respectively connected to the emitters of the transistors $Q_{5a}$ and $Q_{6a}$ through the load resistors $R_{L1}$ and $R_{L2}$. In addition, the collectors of the transistors $Q_{1b}$ and $Q_{2b}$ are respectively cascode-connected to the emitters of the common base transistors $Q_{3b}$ and $Q_{4b}$. The collectors of the transistors $Q_{3b}$ and $Q_{4b}$ are respectively connected to the emitters of the transistors $Q_{5b}$ and $Q_{6b}$, and at the same time, are connected to the bases of the transistors $Q_{5a}$ and $Q_{6a}$.

The common bases of the transistors $Q_{3a}$ and $Q_{4a}$ and of the transistors $Q_{3b}$ and $Q_{4b}$ are respectively connected to the constant voltage sources $V_{Ba}$ and $V_{Bb}$. The constant voltage source $V_{BB}$ is connected to the common base of the transistors $Q_{5b}$ and $Q_{6b}$. Furthermore, the collectors of the transistors $Q_{5a}$ and $Q_{6a}$ are respectively connected to the cathodes of the diodes $D_1$ and $D_2$. The anodes of the diodes $D_1$ and $D_2$ and the collectors of the transistors $Q_{5b}$ and $Q_{6b}$ are connected to the constant voltage $V_C$.

In the DC amplifier having the above-described arrangement, the transistors $Q_{1a}$ to $Q_{6a}$ constitute differential amplification transistor pairs. A fundamental operation of this amplifier is the same as that of the amplifier shown in FIG. 1, and the transistors $Q_{1b}$ to $Q_{6b}$ are the same as those used in the amplifier in FIG. 1. The embodiment in FIG. 2 is different from that in FIG. 1 in that the transistors $Q_{1b}$ to $Q_{6b}$ constitute a single differential amplifier circuit so that a base-emitter voltage $\Delta V_{BE}$ of a transistor can be added.

Similar to the case of FIG. 1, the half of the differential amplifier will be described below. In this case, an output voltage $V_{out''}$ can be represented as follows:

$$V_{out''} = \{(r_E+R_L)/(r_E+R_E/2)\} \cdot V_{in} + \{(r_E+R_L)/(r_E+R_E/2)\} \cdot \Delta V_{BE} - 2V_{BE} \quad (8)$$

for $R_E = R_{Ea} = R_{Eb} << R_{1a} = R_{1b} = R_{2a} = R_{2b}$.

In equation (8), the first term of the right-hand side is an output voltage determined by the input voltage $V_{in}$, and a value defined by the second term is generated when heat generated by the transistors $Q_{1a}$, $Q_{2a}$, $Q_{1b}$, and $Q_{2b}$ are changed upon a bias change due to the input voltage $V_{in}$, and the voltage $V_{BE}$ is changed. In addition, if the base current of each transistor is neglected, the third term represents a sum of the base-emitter voltage $V_{BE}$ of the transistor $Q_{5a}$ driven by an operating current of the transistor $Q_{1a}$ of the differential amplification transistors $Q_{1a}$ and $Q_{2a}$, and the base-emitter voltage $V_{BE}$ of the transistor $Q_{5b}$ driven by an operating current of the transistor $Q_{1b}$ of the differential amplification transistors $Q_{1b}$ and $Q_{2b}$.

If the resistance of the load resistor $R_L$ is determined so as to set the coefficient of $\Delta V_{BE}$ of the second term of equation (8) to be "2", the following equations can be established:

$$(r_E + R_L)/(r_E + R_E/2) = 2 \quad (9)$$

$$\therefore R_L = 2r_E + R_E - r_E = r_E + R_E \quad (10)$$

If $r_E << R_E$, $$R_L \simeq R_E \quad (11)$$

Therefore, if equation (11) is substituted into equation (8), $$V_{out''} \simeq 2 \cdot V_{in} \quad (12)$$

As is apparent from the above equation, a high-performance DC amplifier having a gain of "2", which does not include an error due to the absolute value of the resistor $R_E$ ($R_L$) and variations in base-emitter voltage $V_{BE}$ of each transistor, can be realized.

In the above-described embodiments, the collectors of the differential amplification transistors are cascode-connected to the emitters of the common base transistors. However, the present invention is not limited to this circuit arrangement, and various changes and modifications can be made within the spirit and scope of the invention.

As has been described above, according to the present invention, if only relative precision of circuit elements such as resistors and transistors constituting an amplifier is high, a stable DC amplifier having a gain of "1" or "2" can be realized. This amplifier is suitably applied to formation of an amplifier IC. The present invention is advantageous in obtaining a DC amplifier especially exhibiting highly stable characteristics with respect to temperature variations.

What is claimed is:

1. A DC amplifier comprising a first differential amplification circuit including first and second transistors forming a first differential amplification transistor pair, an emitter resistor connected between emitters of said first and second transistors, and load resistors connected to collectors of said first and second transistors respectively, and a second differential amplification circuit including third and fourth transistors equivalent to said first and second transistors and forming a second differential amplification transistor pair, bases of said third and fourth transistors being commonly connected to bases of said first and second transistors, respectively, and an emitter resistor connected between emitters of said third and fourth transistors, wherein a resistance of each of said load resistors is set to be equal to that of each of said emitter resistors, emitters of fifth and sixth transistors equivalent to said first and second transistors are respectively connected to the collectors of said first and second transistors through said respective load resistors, emitters of seventh and eighth transistors equivalent to said third and fourth transistors are respectively connected to collectors of said third and fourth transistors, bases of said fifth and sixth transistors are respectively connected to the emitters of seventh and eighth transistors, and biases of said first to eighth transistors are set to be close to each other.

2. The DC amplifier defined by claim 2 further comprising ninth and tenth transistors having collectors respectively coupled to the emitters of said seventh and eighth transistors, having emitters respectively coupled to the collectors of said third and fourth transistors and wherein the base of said ninth transistor is coupled to the base of said tenth transistor.

* * * * *